US011481016B2

(12) United States Patent
Olarig et al.

(10) Patent No.: US 11,481,016 B2
(45) Date of Patent: Oct. 25, 2022

(54) METHOD AND APPARATUS FOR SELF-REGULATING POWER USAGE AND POWER CONSUMPTION IN ETHERNET SSD STORAGE SYSTEMS

(71) Applicant: Samsung Electronics Co., Ltd., Suwon-si (KR)

(72) Inventors: Sompong Paul Olarig, Pleasanton, CA (US); Wentao Wu, Milpitas, CA (US); Ramdas P. Kachare, Cupertino, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 390 days.

(21) Appl. No.: 15/975,463

(22) Filed: May 9, 2018

(65) Prior Publication Data
US 2019/0272021 A1    Sep. 5, 2019

Related U.S. Application Data

(60) Provisional application No. 62/638,035, filed on Mar. 2, 2018.

(51) Int. Cl.
*G06F 1/3234* (2019.01)
*G06F 1/26* (2006.01)
(Continued)

(52) U.S. Cl.
CPC ............ *G06F 1/3275* (2013.01); *G06F 1/266* (2013.01); *G06F 1/3206* (2013.01); *G11C 5/14* (2013.01); *H04L 67/1097* (2013.01)

(58) Field of Classification Search
CPC ............... G06F 1/3225; G06F 11/2015; G06F 11/3062; G06F 11/3476; G06F 1/263;
(Continued)

(56) References Cited

U.S. PATENT DOCUMENTS 6,574,740 B1  6/2003  Odaohhara et al.
6,785,827 B2  8/2004  Layton et al.
(Continued)

FOREIGN PATENT DOCUMENTS

CN        104951384      9/2015
KR    10-2006-0009264 A  1/2006

OTHER PUBLICATIONS

U.S. Office Action dated Jul. 8, 2020, issued in U.S. Appl. No. 16/167,306 (27 pages).
(Continued)

*Primary Examiner* — Chad G Erdman
(74) *Attorney, Agent, or Firm* — Lewis Roca Rothgerber Christie LLP (57) ABSTRACT

Embodiments of the present invention include a solid state storage device for reporting actual power consumption including an internal power metering unit, a memory including flash memory, one or more components comprising at least a controller and the memory, wherein the memory has stored thereon instructions that are configured to be executed by the controller, and one or more voltage rails connecting the power metering unit to the one or more components so that the power metering unit is capable of measuring power consumed by the one or more components of the storage device.

19 Claims, 9 Drawing Sheets

(51) Int. Cl.
  *H04L 67/1097* (2022.01)
  *G11C 5/14* (2006.01)
  *G06F 1/3206* (2019.01)

(58) Field of Classification Search
  CPC ... G06F 1/266; G06F 1/28; G06F 1/30; G06F 1/3206; G06F 1/3221; G06F 1/3268; G06F 1/3275; G06F 1/3287; G06F 2201/81; G06F 3/0625; G06F 3/0653; G06F 3/0679; G06F 3/0688; G11C 2029/0409; G11C 2029/5002; G11C 5/14; H04L 67/1097
  See application file for complete search history.

(56) References Cited

U.S. PATENT DOCUMENTS

| | | | |
|---|---|---|---|
| 7,064,994 B1* | 6/2006 | Wu | G06F 1/206 |
| | | | 702/132 |
| 7,269,751 B2 | 9/2007 | Janakiraman et al. | |
| 7,539,881 B2 | 5/2009 | Shaw et al. | |
| 8,051,316 B2 | 11/2011 | Roberts et al. | |
| 9,477,295 B2 | 10/2016 | Jreji et al. | |
| 10,268,262 B2 | 4/2019 | Khatri et al. | |
| 10,324,642 B2 | 6/2019 | Sweere et al. | |
| 10,424,938 B2 | 9/2019 | Guo et al. | |
| 11,093,135 B1 | 8/2021 | Ali | |
| 2003/0088798 A1* | 5/2003 | Ono | G06F 1/266 |
| | | | 713/310 |
| 2004/0215912 A1 | 10/2004 | Vergis et al. | |
| 2005/0102544 A1 | 5/2005 | Brewer et al. | |
| 2006/0288241 A1 | 12/2006 | Felter et al. | |
| 2007/0028130 A1* | 2/2007 | Schumacher | G06F 1/3203 |
| | | | 713/320 |
| 2007/0067657 A1 | 3/2007 | Ranganathan et al. | |
| 2008/0043556 A1* | 2/2008 | Nale | G06F 1/206 |
| | | | 365/212 |
| 2009/0287947 A1 | 11/2009 | DuBose | |
| 2010/0019576 A1 | 1/2010 | Buterbaugh et al. | |
| 2010/0164292 A1 | 7/2010 | Freeman et al. | |
| 2010/0264741 A1 | 10/2010 | Togare | |
| 2011/0029788 A1 | 2/2011 | Domingo et al. | |
| 2011/0144818 A1 | 6/2011 | Li et al. | |
| 2011/0178652 A1 | 7/2011 | Carter et al. | |
| 2012/0030489 A1 | 2/2012 | Patil et al. | |
| 2012/0137172 A1 | 5/2012 | Gardelegen et al. | |
| 2012/0210149 A1 | 8/2012 | Carter et al. | |
| 2012/0303993 A1 | 11/2012 | Nishtala et al. | |
| 2013/0085623 A1 | 4/2013 | Izumisawa et al. | |
| 2013/0185583 A1* | 7/2013 | Stewart | G06F 9/542 |
| | | | 713/340 |
| 2014/0003180 A1* | 1/2014 | Matsuda | G11B 5/012 |
| | | | 365/226 |
| 2014/0101475 A1 | 4/2014 | Berke et al. | |
| 2014/0149760 A1 | 5/2014 | Drake et al. | |
| 2014/0281606 A1 | 9/2014 | Evans et al. | |
| 2015/0120874 A1 | 4/2015 | Kim et al. | |
| 2015/0121113 A1 | 4/2015 | Ramamurthy et al. | |
| 2015/0177814 A1 | 6/2015 | Bailey et al. | |
| 2015/0200566 A1 | 7/2015 | Huang et al. | |
| 2015/0249363 A1 | 9/2015 | Humphrey, Jr. et al. | |
| 2015/0309752 A1* | 10/2015 | Ellis | G06F 1/329 |
| | | | 711/103 |
| 2015/0331473 A1 | 11/2015 | Jreji et al. | |
| 2015/0338910 A1 | 11/2015 | Allen-Ware et al. | |
| 2015/0362985 A1 | 12/2015 | Thompson | |
| 2016/0014045 A1 | 1/2016 | Terai | |
| 2016/0085288 A1 | 3/2016 | Khatib et al. | |
| 2016/0179117 A1* | 6/2016 | Eastep | G06F 1/3296 |
| | | | 700/291 |
| 2016/0282892 A1 | 9/2016 | Saavedra et al. | |
| 2016/0370843 A1 | 12/2016 | Gatson et al. | |
| 2017/0011150 A1 | 1/2017 | Sons et al. | |
| 2017/0031409 A1 | 2/2017 | Lester et al. | |
| 2017/0031431 A1 | 2/2017 | Khatri et al. | |
| 2017/0031857 A1 | 2/2017 | Qiu | |
| 2017/0160781 A1 | 6/2017 | Piga et al. | |
| 2017/0177262 A1 | 6/2017 | Sharma et al. | |
| 2017/0235519 A1 | 8/2017 | Qiu et al. | |
| 2017/0315599 A1 | 11/2017 | Marripudi et al. | |
| 2017/0322613 A1 | 11/2017 | Lin et al. | |
| 2018/0107258 A1 | 4/2018 | Remis et al. | |
| 2018/0232303 A1* | 8/2018 | Roeder | G11C 5/143 |
| 2019/0018474 A1* | 1/2019 | Bacchus | G06F 1/3206 |
| 2019/0018611 A1* | 1/2019 | Kim | G06F 3/0653 |
| 2019/0065089 A1* | 2/2019 | Myers | G06F 3/0625 |
| 2019/0065243 A1* | 2/2019 | Eckert | G06F 3/0659 |
| 2019/0196742 A1* | 6/2019 | Yudanov | G06F 3/0659 |
| 2019/0272021 A1 | 9/2019 | Olarig | |
| 2020/0125159 A1 | 4/2020 | Messick et al. | |
| 2021/0026428 A1 | 1/2021 | Olarig et al. | |
| 2021/0089102 A1 | 3/2021 | Kachare et al. | |
| 2021/0232198 A1 | 7/2021 | Kachare et al. | |

OTHER PUBLICATIONS

MPS, The Future of Analog IC Technology, "PMU for SSD Evaluation Board", EV5505A-L-00A, Rev. 1.1, Mar. 24, 2015, 6 pages, www.MonolithicPower.com.
U.S. Final Office Action dated Sep. 14, 2020, issued in U.S. Appl. No. 16/167,306 (13 pages).
U.S. Notice of Allowance dated Mar. 10, 2021, issued in U.S. Appl. No. 16/167,306 (10 pages).
U.S. Office Action dated Aug. 31, 2021, issued in U.S. Appl. No. 17/112,933 (38 pages).
U.S Final Office Action dated Dec. 22, 2021, issued in U.S. Appl. No. 17/112,933 (31 pages).
Notice of Allowance for U.S. Appl. No. 16/167,306 dated Feb. 9, 2022, 8 pages.
Notice of Allowance for U.S. Appl. No. 16/167,306 dated Jun. 4, 2021, 9 pages.
Notice of Allowance for U.S. Appl. No. 16/167,306 dated May 3, 2022, 9 pages.
Notice of Allowance for U.S. Appl. No. 16/167,306 dated Nov. 23, 2020, 9 pages.
Notice of Allowance for U.S. Appl. No. 16/167,306 dated Sep. 1, 2021, 9 pages.
Office Action for U.S. Appl. No. 17/112,933 dated Mar. 14, 2022, 38 pages.
Office Action for U.S. Appl. No. 17/233,303 dated Apr. 27, 2022, 28 pages.
Restriction Requirement for U.S. Appl. No. 16/167,306 dated Apr. 20, 2020, 12 pages.
Restriction Requirement for U.S. Appl. No. 17/233,303 dated Jan. 19, 2022, 9 pages.
U.S. Final Office Action dated Jul. 19, 2022, issued in U.S. Appl. No. 17/112,933 (47 pages).
U.S. Notice of Allowance dated Aug. 18, 2022, issued in U.S. Appl. No. 16/167,306 (8 pages).

* cited by examiner

METHOD AND APPARATUS FOR SELF-REGULATING POWER USAGE AND POWER CONSUMPTION IN ETHERNET SSD STORAGE SYSTEMS

CROSS-REFERENCE TO RELATED APPLICATION(S)

This application claims the benefit of U.S. Provisional Patent Application Ser. No. 62/638,035, filed Mar. 2, 2018, the content of which is hereby incorporated by reference in its entirety.

BACKGROUND

Many companies provide cloud-based storage to end users so that end users will have the ability to remotely access their stored data. Such companies generally take advantage of Ethernet-attached solid state drives (eSSDs) for their storage requirements. In particular, Ethernet-attached non-volatile memory express NVMe SSDs (e.g., NVMe Over Fabrics [NVMe-oF] storage devices) are considered an emerging and disruptive technology in this area.

Cloud-based storage providers typically charge users for storing their data on a monthly or annual basis based on the total storage space allocated to the user and either the average cost of energy consumed by all users or the maximum power consumption capable of being consumed by the user based on the system. For example, for two users who have purchased the same amount of cloud storage space, a user who stores only a small amount of data relative to the total purchased storage space and only stores data on an infrequent basis will be charged the same as a user who is regularly removing and added new data and using the majority of his/her purchased storage space. Ideally, users should be charged for storage based on the energy resources actually consumed. However, there is no accurate method for calculating the power consumption of individual users, or calculating power consumption in real time.

A storage device and method are needed that enables the storage device to report to the host the actual power consumption by the storage device.

The above information disclosed in this Background section is only for enhancement of understanding of the background of the disclosure and therefore it may contain information that does not constitute prior art.

SUMMARY

Embodiments of the present invention include a solid state storage device for reporting actual power consumption, including an internal power metering unit, a memory including flash memory, one or more components comprising at least a controller and the memory, wherein the memory has stored thereon instructions that are configured to be executed by the controller, and one or more voltage rails connecting the power metering unit to the one or more components so that the power metering unit is capable of measuring power consumed by the one or more components of the storage device.

Embodiments also include a method of reporting power consumption of a solid state storage device, the storage device including an internal power metering unit, a memory including flash memory, one or more components comprising at least a controller and the memory, wherein the memory has stored thereon instructions that are configured to be executed by the controller, and one or more voltage rails connecting the power metering unit to the one or more components so that the power metering unit is capable of measuring power consumed by the one or more components of the storage device, the method including measuring at the power metering unit the power consumed by the one or more components of the storage device.

Embodiments also include a storage system comprising a local service processor, and one or more solid state storage devices connected to the local service processor, each solid state storage device of the one or more solid state storage devices including an internal power metering unit, a memory including flash memory, one or more components comprising at least a controller and the memory, wherein the memory has stored thereon instructions that are configured to be executed by the controller; and one or more voltage rails connecting the power metering unit to the one or more components so that the power metering unit is capable of measuring power consumed by the one or more components.

BRIEF DESCRIPTION OF THE DRAWINGS

Further features and aspects will become apparent and will be best understood by reference to the following detailed description reviewed in conjunction with the drawings. In the drawings.

DETAILED DESCRIPTION

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Embodiments of the present invention include a storage device, such as an SSD, that be capable of reporting its actual power consumption to the local service processor, for example, a baseboard management controller (BMC). This enables the local service processor to provide power profiles and consumption of the storage device. In some embodiments, the storage device can report to the local service processor or BMC via a system management bus (SMBus) or a Peripheral Component Interconnect Express (PCIe), and can report by one of various protocols, such as by a Management Component Transport Protocol (MCTP) or by a NVMe Management Interface protocol for NVMe SSDs storage devices. In some embodiments, the storage system may be an NVMe-oF based system. Further embodiments include a storage system including several storage devices in which each storage device is capable of reporting its actual power consumption to the local service processor. In such a system, the local service processor can provide power profiles and analytics of the storage system and individual storage devices in the system.

Figure 1:
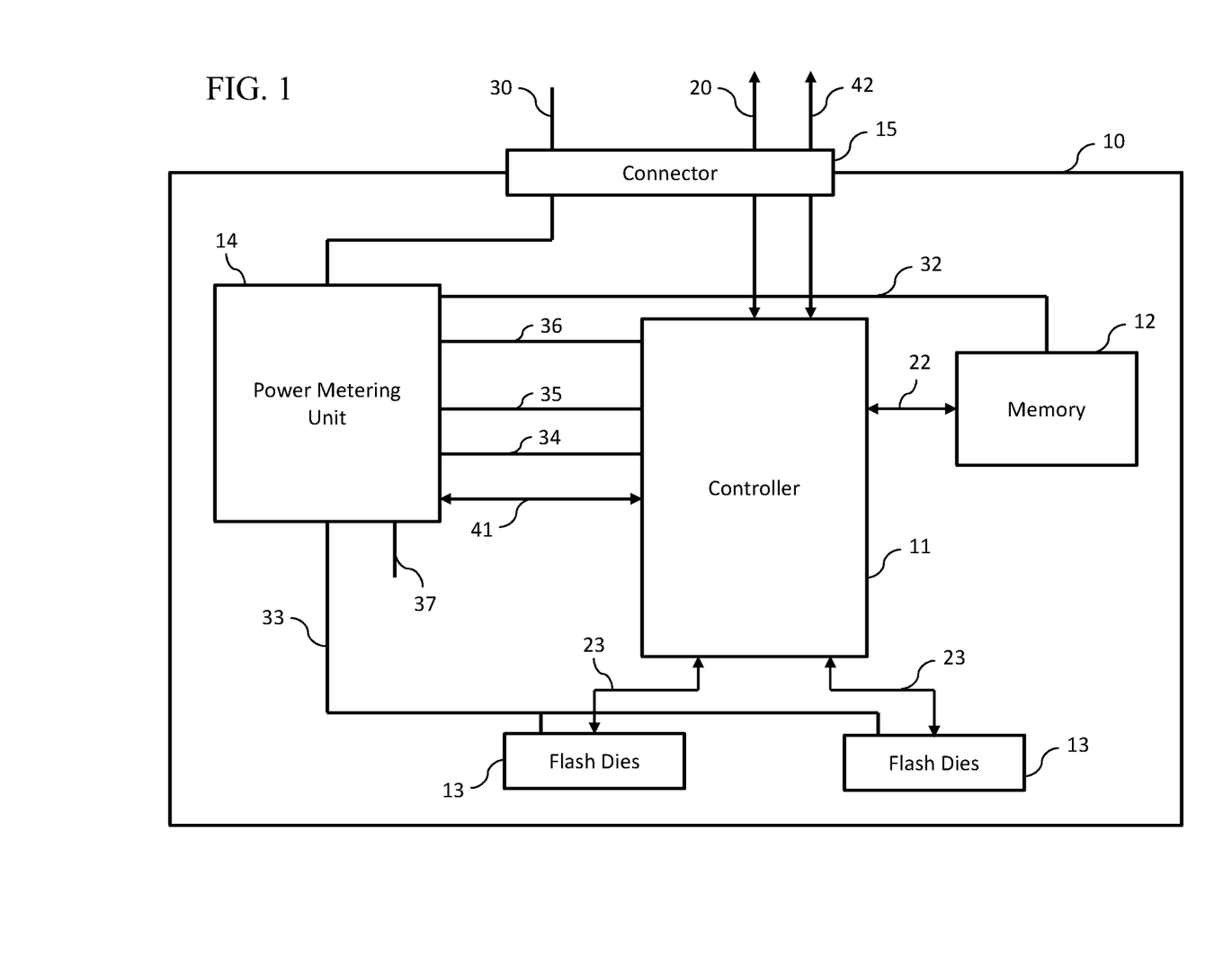
FIG. 1 is an internal block diagram of a storage device according to an embodiment of the present invention.

FIG. 1 depicts an internal block diagram of a storage device 10 according to an embodiment of the present invention. While diagram depicts features relevant to the illustrated embodiment of the invention, the storage device 10 may include additional components. In some embodiments, the storage device 10 may be an SSD, an eSSD, an NVMe SSD, an NVMe-oF SSD, a SAS or SATA.

The storage device 10 includes internal components, including a controller 11, a memory 12, flash dies 13, a power metering unit (PMU) 14 and a connector 15. The controller 11, as known as the processor, implements firmware to retrieve and store data in the memory 12 and flash dies 13 and to communicate with a host computer. In some embodiments, the controller 11 may be an SSD controller, an ASIC SSD controller, or an NVMe-oF/EdgeSSD controller. The memory 12 can be a random access memory such as DRAM or MRAM and the flash dies 13 may be NAND flash memory devices, though the invention is not limited thereto. The controller 11 can be connected to the memory 12 via memory channel 22 and can be connected to the flash dies 13 via flash channels 23. The controller 11 can communicate with a host computer via a host interface 20 that connects the controller 11 to the host computer through the connector 15. In some embodiments, the host interface 20 may be a PCIe connection, an Ethernet connection or other suitable connection. The connector 15 may be U.2/M.2 connectors or other suitable connector(s). The PMU 14 allows the storage device 10 to support power management capabilities by measuring power consumption of the storage device 10.

The storage device 10 is supplied power through the connector 15 via power rail 30. Power rail 30 supplies power to the various components of the storage device 10. For example, the power rail 30 may supply power to the various components of the storage device 10 via the PMU 14 and various intermediary voltage rails. An embodiment of this is shown in FIG. 1, in which the power rail 30 supplies power to the PMU 14, which then distributes power to other components of the storage device 10. For example, the PMU 14 drives power to the flash dies 13 via flash voltage rail 33. The PMU 14 may similarly drive power to the memory 12 via memory voltage rail 32. Voltage can be supplied to the controller 11 by the PMU 14 through multiple voltage rails, such as, for example, a core voltage rail 34, an I/O voltage rail 35 and one or more other voltage rails 36. Additional voltage rails, such as an additional voltage rail 37, may be included to connect other various components that may be included in the storage device 10. The various voltage rails 30, 33, 34, 35, 36, 37 used in the storage device 10 can be in a range of from 12V down to 0.6V, including 12V and/or 3.3V rails, for example, when the storage device 10 is an NVMe SSD.

In addition to supplying power to the storage device 10, power supply rails are provided by the PMU 14 inside the storage device 10 to generate power consumption measurements ("power measurements") of the various voltages rails used by the components of the storage device 10, for example, used by components such as the controller 11, the flash dies 13, the memory 12 and other various components that may be included in the storage device 10. In some embodiments, the PMU 14 can be programmed to support get/set Power State by Power Info.

The PMU 14 can measure the amount of current drawn on various voltage rails it is driving, for example, voltage rails 32, 33, 34, 35, 36 and 37. The PMU can output power measurements including the average, minimum and maximum voltage usage by the voltage rails 32, 33, 34, 35, 36 and 37 of the storage device 10. In some embodiments, the PMU 14 can meter each voltage rail 32, 33, 34, 35, 36 and 37 individually, with the summation of all voltage rails 32, 33, 34, 35, 36 and 37 used by the storage device 10 being the total power consumed by the storage device 10. The power measurements metered at the PMU 14 can be read by the controller 11 using a PMU/controller interface 41. In some embodiments, the PMU/controller interface 41 may be an I2C/SMBus. The controller 11 can then provide these power measurements to a local service processor 50 (see FIG. 3), such as a BMC, via either the host interface 20 or a separate controller/host interface 42. If a separate controller/host interface 42 is used, that interface may be an I2C/SMBus. If the controller/host interface 42 is a PCIe connection, the controller 11 can provide power measurements to the local service processor 50 via NVMe-MI or MCTP protocols, as shown in FIG. 4. The PMU 14 can report/output the power measurements periodically as specified by the local service processor 50 or passively keep track via internal counters which are accessible to the local service processor 50.

Figure 2:
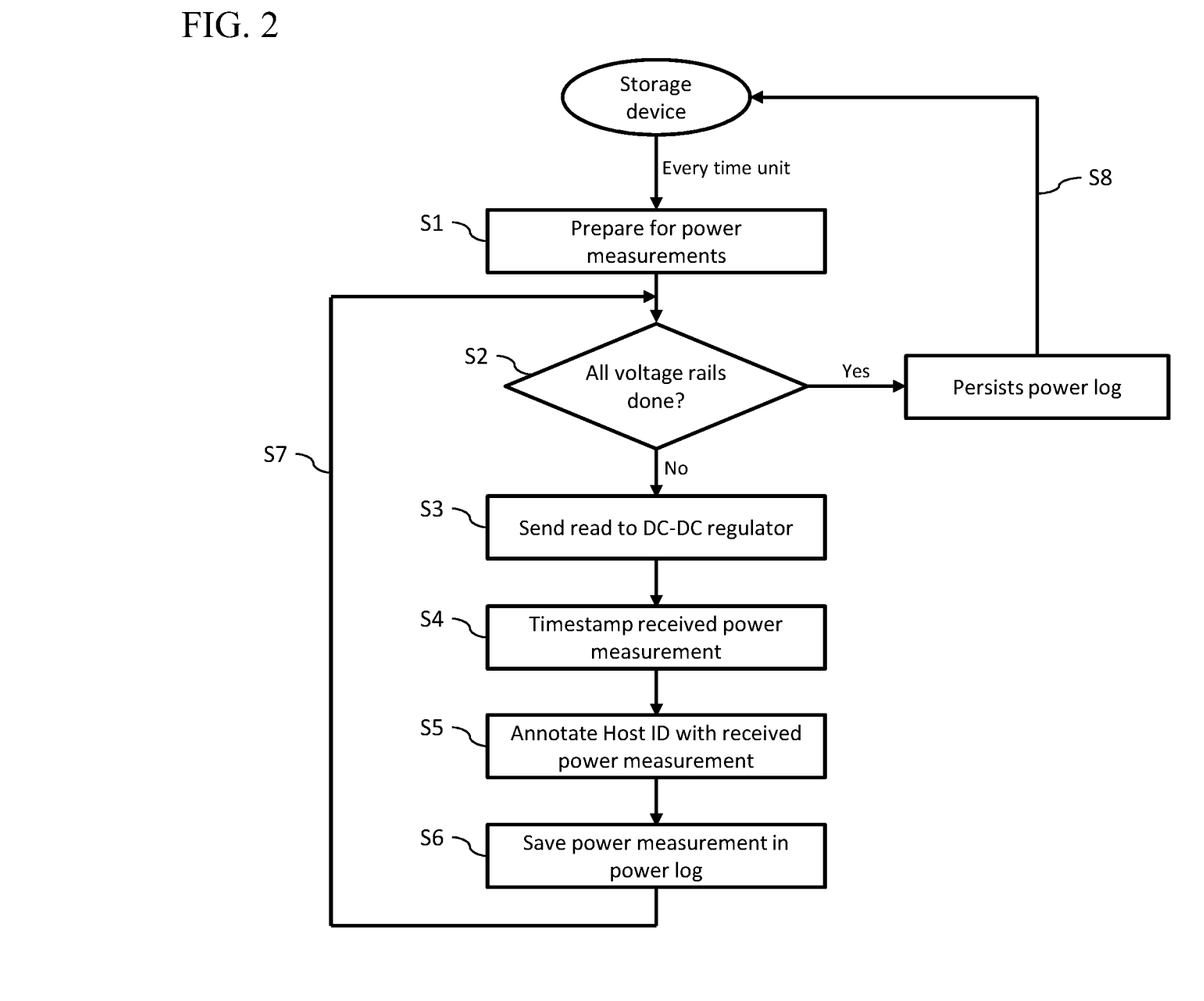
FIG. 2 is a flow chart of a method for collecting power consumption measurements from a power measurement unit in the storage device of FIG. 1.

FIG. 2 is a flow chart of a method for collecting power consumption measurements from the PMU 14 of the storage device 10. As shown in FIG. 2, power measurements can be read at predetermined intervals. For example, the power measurements can be read from the PMU 14 of the storage device 10 at the user's configurable frequency such as 1 second, 5 seconds, more than 5 seconds, or every few minutes. In other embodiments, that storage device 10 can read the power measurements only as needed (see, e.g., FIGS. 8 and 9), for example, at the completion of a specific job. The frequency at which the power measurements are read is hereinafter called a time unit.

For every time unit, the controller 11 prepares (S1) to receive power measurements from the PMU 14 for the various voltage rails 30, 33, 34, 35, 36, 37. The controller 11 queries (S2) the PMU 14 to determine if power measurements from all rails have been completed. If no, then a read request (S3) is sent to a DC-DC regulator at the PMU 14 corresponding to a voltage rail for which power measurements have not been received (the PMU 14 may include a number of DC-DC regulators each corresponding to unique voltage rail). This read request may be send via an I2C protocol via the PMU/controller interface 41. When the power measurement is received from the PMU 14, the power measurement is then annotated with a timestamp (S4) and a Host ID (S5). The received power measurement is then saved (S6) to a power log. The power log may include internal register(s) or may be included as part of the PMU's embedded non-volatile memory.

Once the received power measurement is saved, the PMU 14 is again queried (S7) until all power measurements are received from the various voltage rails 30, 33, 34, 35, 36, 37. Once all power measurements are complete and the annotated power measurements are saved in the power log, these power measurements persist (S8) in the power log through resets and power cycles.

In addition to the above annotations, the power log pages can also include any or all of the following: Namespace ID, NMV Set, read I/Os, write I/Os, SQ ID, Stream ID, and other suitable parameters. The controller 11 also implements actual power (AP) registers which are accessible by the local service processor 50. This allows a variety of parameters associated with the storage device and the power measurements to be mapped with fine granularity.

In some embodiments, the power log can be special proprietary or vendor defined log pages. The power log can be read by the local service processor 50 using existing protocols through either the host interface 20 or the separate controller/host interface 42, whichever is used. For example, the power log can be read by a BMC using the NVMe-MI protocol via the controller/host interface 42, which may be a SMBus or PCIe.

The above method provides dynamic, real-time output of actual power consumption measurements without affecting the I/O of the storage device. With the power measurement information, the local service processor can implement power budgets and allocate power to the storage device based on its actual power usage. For example, the local service processor can implement power budgets similar to existing industry standards for allocated power budget registers. Also, the storage device can report real time power consumption to system management software, such as Samsung's DCP or Redfish.

Figure 3:
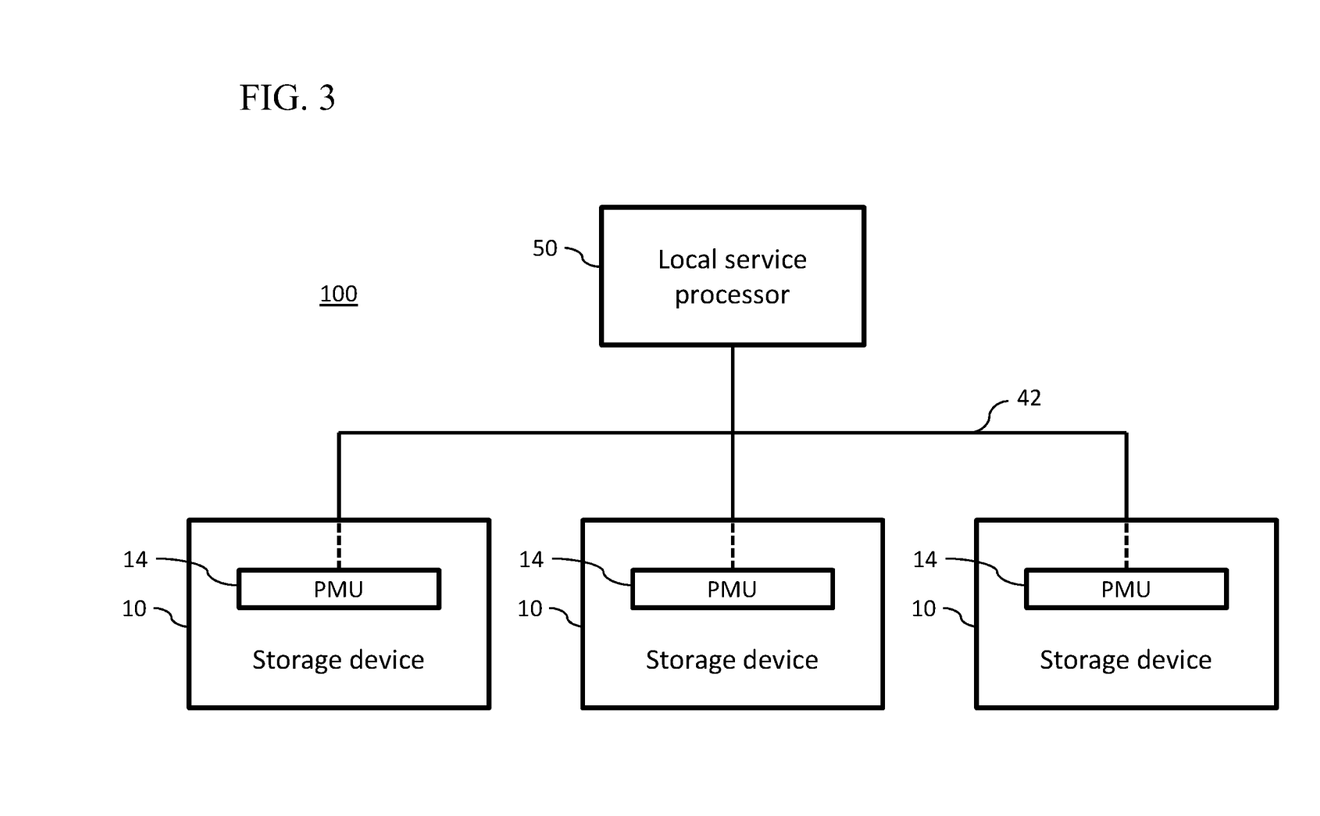
FIG. 3 is a schematic diagram of a storage system incorporating multiple storage devices that are capable of providing power measurements.
Figure 4:
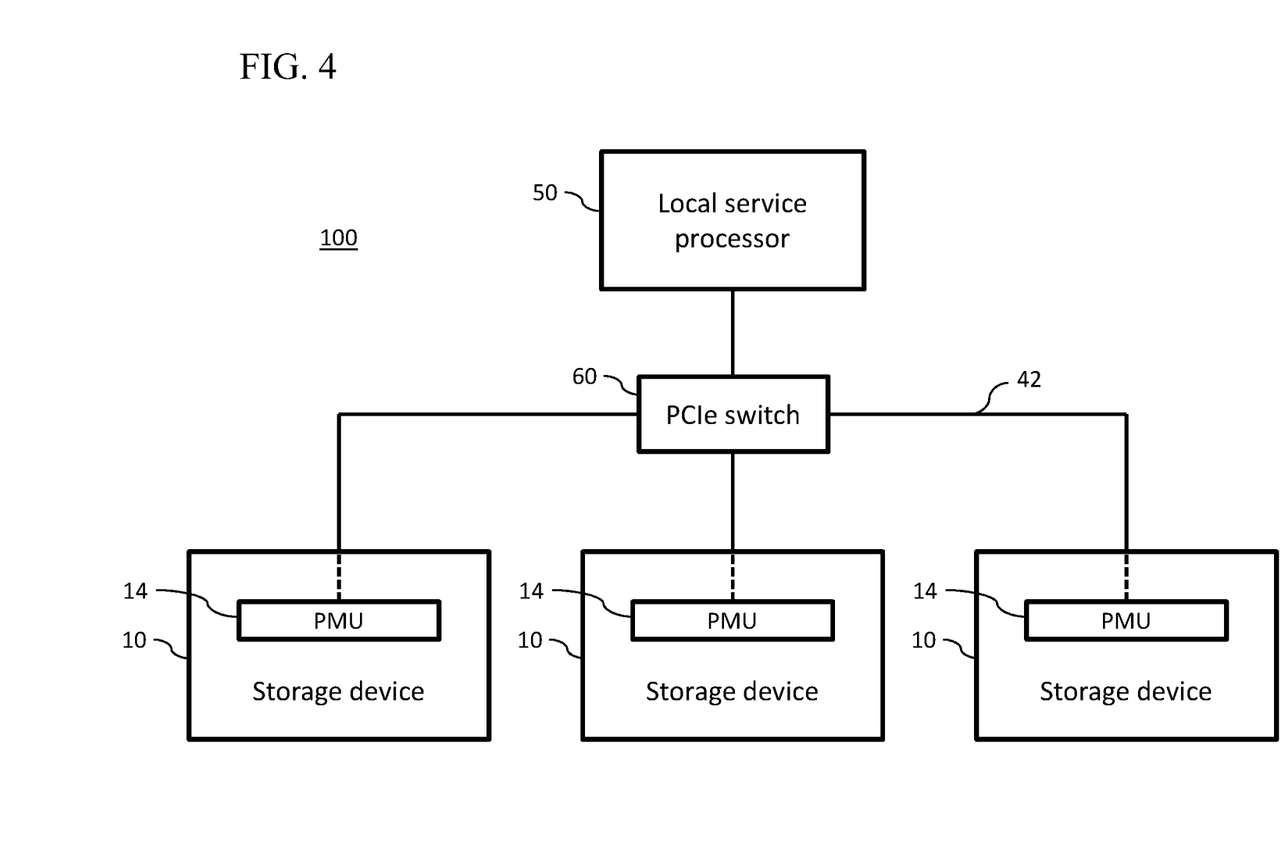
FIG. 4 is a block diagram of an embodiment of the storage system of FIG. 3 in which a PCIe switch is used.

FIG. 3 is a block diagram of a storage system 100 incorporating multiple storage devices 10. The storage system 100 includes the local service processor 50 attached to multiple storage devices 10. Each storage device 10 has a PMU 14 to measure power consumption as described above with respect to FIGS. 1 and 2. In the illustrated embodiment, the storage devices 10 provide power measurements to the local service processor 50 via the controller/host interface 42. In some embodiments, the controller/host interface 42 may be an I2C/SMBus or PCIe bus. The power measurements may be transferred to the local service processor 50 using NVMe protocols, such as NVMe-MI, MCTP over PCI-e, or I2C Bus protocols. If the storage device 10 is connected via a SMBus/I2C connection, the local service processor 150 can even access the power log during a power failure using these existing protocols.

FIG. 4 is a block diagram of an embodiment of the storage system 100 of FIG. 3 in which a PCIe switch 60 is used. In this embodiment, the storage devices 10 are connected to the local processor 50 via the PCIe switch 60. The power measurements may be transferred to the local service processor 50 via the PCIe switch 60 using suitable protocols such as, for example, NVMe-MI and/or MCTP. The storage devices may be separately connected to the host computer through the host interface 20 via, for example, an Ethernet switch.

In the embodiments of FIGS. 3 and 4, the local service processor 50 and the multiple storage devices 10 can be housed within the same chassis allowing the local service processor 50 to process the power measurements of the multiple storage devices 10 according to chassis power management requirements; however, the invention is not limited thereto. For example, power measurements can also be processed at the individual storage device level.

In embodiments in which the power measurements are transferred to the local service processor 50 using NVMe protocols, NVMe specifications can define power measurements and their process mechanism. Based on this mechanism, the storage devices 10 (e.g., an NVMe SSD) can support power management either queried by the local service processor 50 (FIG. 5) or set by the local service processor 50 (FIG. 6).

Figure 5:
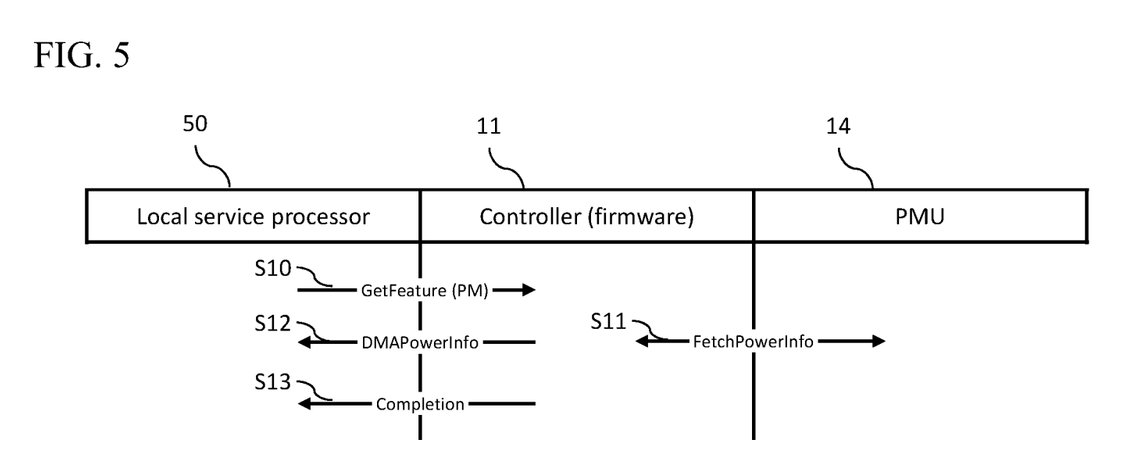
FIG. 5 is a diagram depicting an embodiment in which power measurements are transferred to a local service processor based on a query from the local service processor.

FIG. 5 is a diagram depicting an embodiment in which power measurements are transferred to the local service processor 50 based on a query from the local service processor 50. In this embodiment, the local service processor 50 queries the power measurement information by sending a GetFeature command (S10), for example, FeatureID=0x2, to the firmware of the controller 11 for the storage device 10 from which the local service processor 50 is seeking power measurement information. The controller's firmware then fetches (S11) the power measurement information from the PMU 14. The firmware of the controller 11 receives the information and sends (S12) that information via direct memory access (DMA) to the local service processor 50. The controller's firmware then sends (S13) a completion notice to the local service processor 50 to signal completion of the query. This embodiment allows for real-time retrieval of power measurements from the storage device 10.

Figure 6:
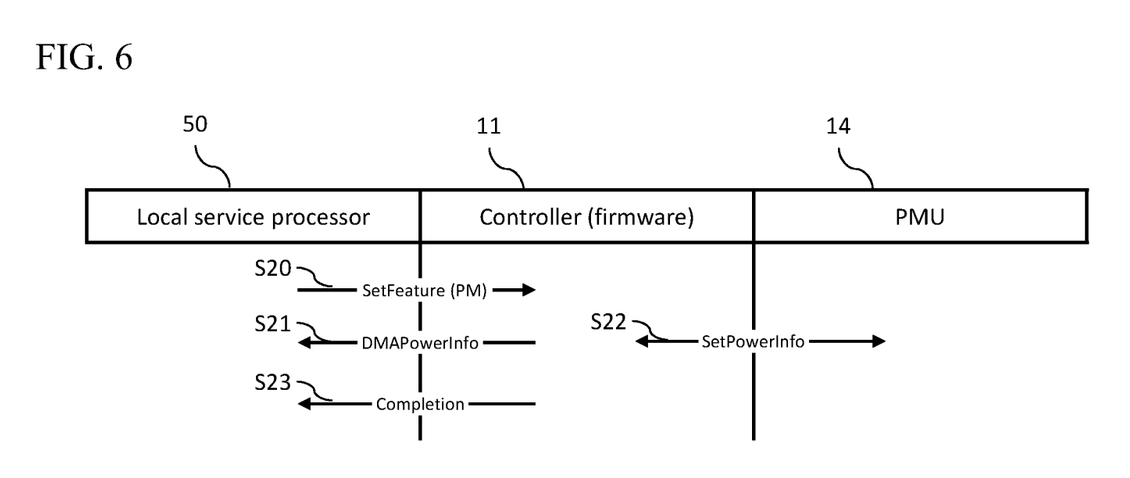
FIG. 6 is a diagram depicting an embodiment in which power measurements are set by the local service processor.

FIG. 6 is a diagram depicting an embodiment in which power measurements are set by the local service processor 50. In this embodiment, the local service processor 50 sets the power measurement information (hereinafter, called the power measurement budget) by sending a SetFeature command (S20), for example, FeatureID=0x2, to the firmware of the controller 11 for the storage device 10 for which the local service processor 50 intends to set the power measurement budget. The controller's firmware then uses DMA to request (S21) the power measurement budget from the local service processor 50. The firmware of the controller 11 receives the information and sets (S22) the power measurement budget of the PMU 14. In response, the controller's firmware processes the new power state transaction. In order to process the new power transaction, the controller's firmware queries the current power state job in the PMU 14 to ensure that all tasks that rely on the current power state are fully completed successfully. Then, the firmware changes the current power state from the current one to the next one required by the power measurement budget. The controller's firmware starts to process new tasks which rely on the power state using the allocated power measurement budget. The controller's firmware then sends (S23) a completion notice to the local service processor 50 to signal that the new power state has been set.

By enabling this SetFeature function, the local service processor 50 can control and throttle the power consumption of a particular storage device 10 to meet an allocated power budget of the local service processor 50. The controller 11 can enforce the power budget allocations programmed by the local service processor 50. If the actual power consumption exceeds the set threshold, the controller 11 can throttle the I/O performance for that parameter in order to minimize power consumption and to stay within the allocated power budget. The controller 11 can, for example, self-adjust by lowering the internal power state automatically when exceeding the allocated power budget. The controller 11 can then report back to the local service processor 50 so that the local service processor 50 can reallocate the available power to some other devices which may need additional power. The controller 11 may also collect statistics about such performance throttling on a fine granularity.

Figure 7:
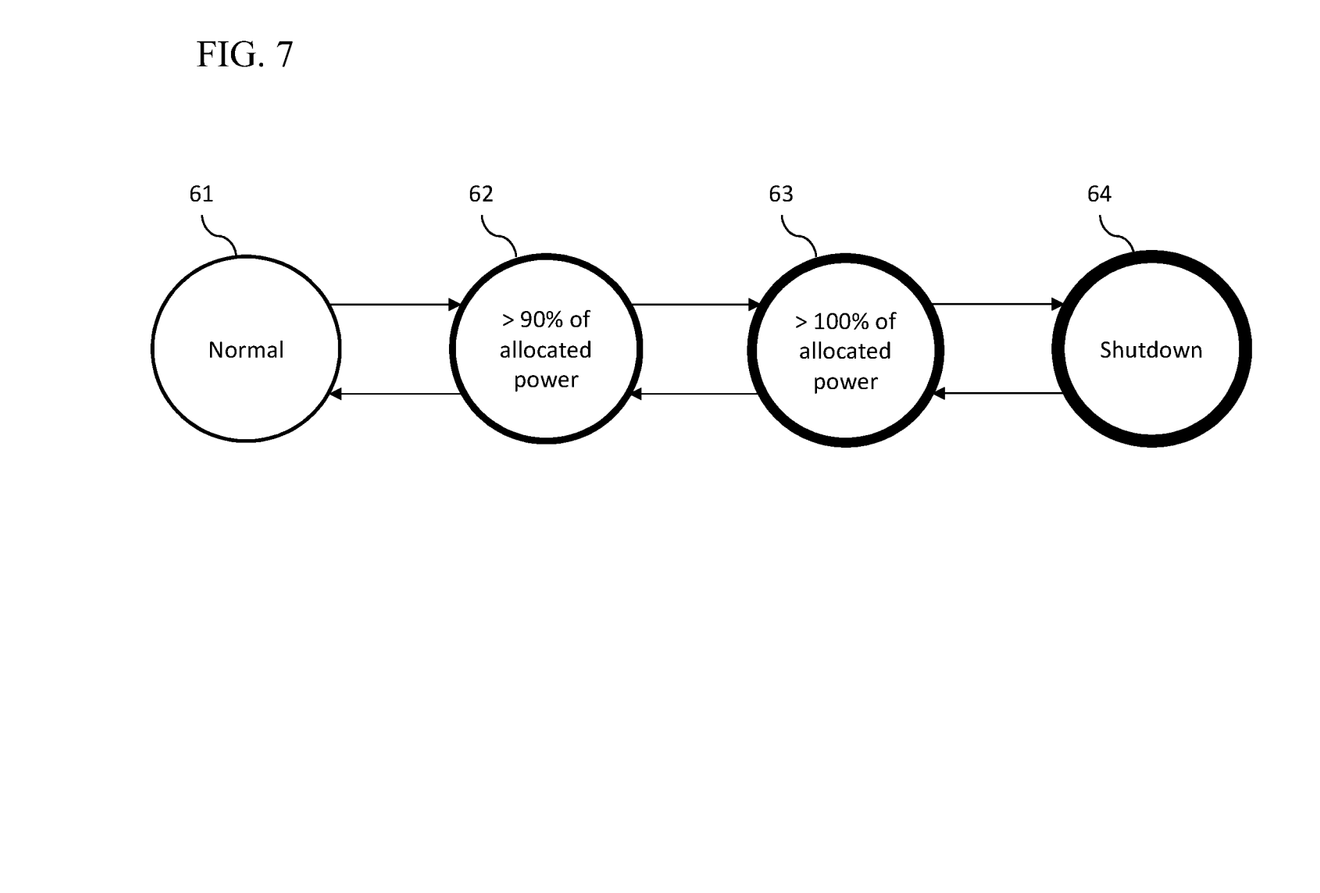
FIG. 7 shows an example of a power policy which can be used to by the local service processor 50 to control power consumption of a storage device 10.

FIG. 7 shows an example of a power policy which can be used by the local service processor 50 to control power consumption of a storage device 10. The local service processor 50 can manage the power policy by monitoring each storage device 10 in the storage system and instructing each storage device 10 to maintain its respective allocated power budget. For example, if a storage device 10 changes from operating at normal 61 to operating at greater than 90% of its allocated power budget, as shown at 62, the controller 11 may throttle I/O performance by, for example, introducing additional latency of a small percentage (e.g., 10% or 20% of idle or overhead). However, if the current state is greater than 100% of its allocated power budget, as shown at 63, the controller 11 may introduce a much bigger latency (e.g., 50% or larger) or may introduce delays to NAND cycles, etc., in order to throttle the storage device 10 to meet its allocated budget. If the storage device 10 continues to exceed its allocated budget despite the introduced latencies, the local service processor 50 may execute shutdown instructions 64 to shutdown the device 10 or the controller 11 may shutdown itself.

In further embodiments, the local service processor 50 can also monitor and detect thermal load increases (temperature rises) or operate the resource during peak utility rate such as hot day times or during brown-out periods to ensure that each storage device 10 is behaving as intended performance-wise.

The above feature makes the storage device capable of autonomous optimizing power vs. performance vs. assigned power budget/state.

Figure 8:
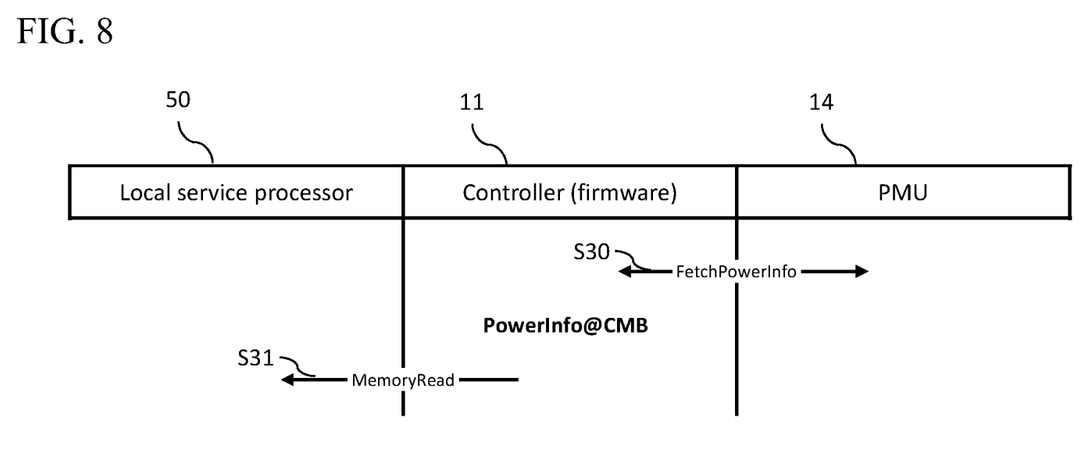
FIG. 8 is a diagram depicting an embodiment in which power measurements are stored in a controller memory buffer until fetched by the local service processor.

FIG. 8 is a diagram depicting a further embodiment in which power measurements are stored in the controller memory buffer until fetched by the local service processor 50. In this embodiment, the controller 11 can store the power measurements locally in its own memory 12 until requested by the local service processor 50. For example, the controller 11 could store the power measurement information in a controller memory buffer of the memory 12 in an embodiment in which the storage device 10 is an NVMe SSD. The NVMe specification define the controller memory buffer (CMB), which is a portion of the storage device's memory, but is assigned by the host/local service processor and owned by the host/local service processor logically.

The firmware of the controller 11 can fetch power measurement information from the PMU 14 and store it in the control memory buffer of the memory 12. The control memory buffer can be updated at any designated time unit. The local service processor 50 can then query the power measurement information by reading the power measurements directly from the controller memory buffer of the memory 12. The power measurements can be read from the control memory buffer via the controller/host interface 42. If the controller/host interface 42 is PCIe, the power measurement information can go through the PCIe to directly process memRd/memWr based on the BAR configuration in order to read from the control memory buffer. In other embodiments, the power measurement information can go through side band such as SmBus or I2C to directly access the control memory buffer.

Alternative to FIG. 8, the storage device 10 can be configured so that the PMU 14 is directly accessible by the local service processor 50 in order for the local service processor to be able to access the power measurement information when desired/needed and in real-time.

Figure 9:
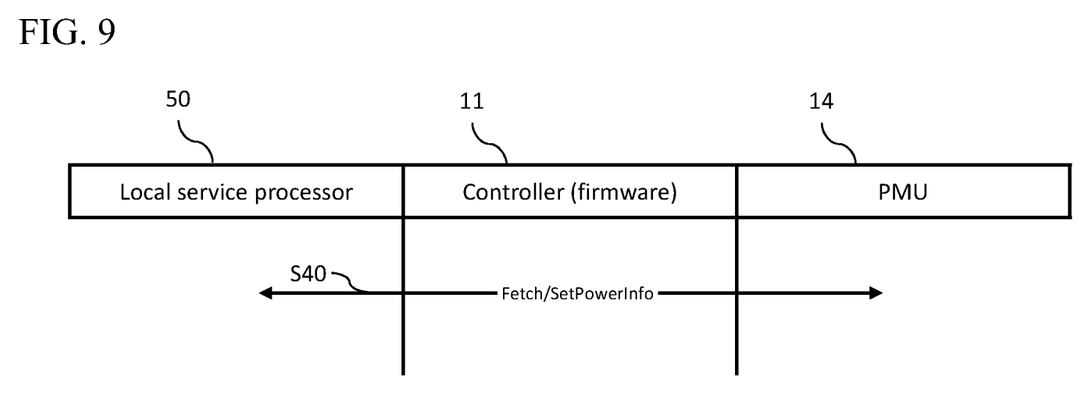
FIG. 9 is a diagram depicting an embodiment in which power measurements taken by a power measurement unit are directly accessible to the local service processor.

FIG. 9 is a diagram depicting an embodiment in which power measurements taken by the PMU 14 are directly accessible to the local service processor 50. In this embodiment, the storage device 10 can be configured with an assistant bus, such as, for example, I2C or AXI, to allow direct access to the PMU 14 by the local service processor 50. This allows the local service processor 50 to be able to process the power measurement information by accessing the PMU 14 directly and allows for retrieval of power measurements in real-time.

Figure 10:
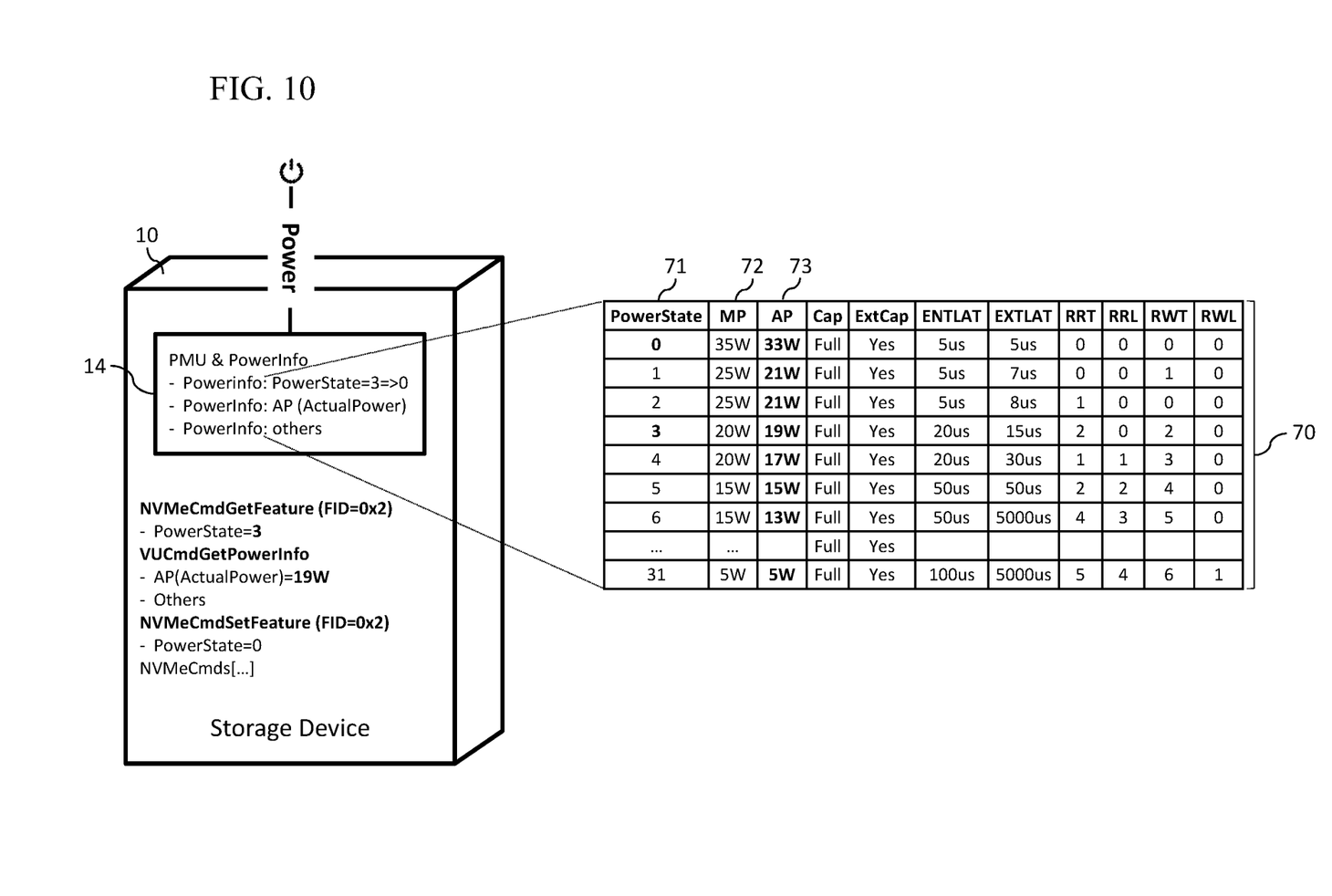
FIG. 10 is an example of a power log according to an embodiment of the present invention.

FIG. 10 is an example of a power log 70 according to an embodiment of the present invention. As illustrated in this embodiment, a storage device 10 may have, for example, up to 32 Power States (PowerState) 71, which are recorded in the power log 70. Each PowerState 71 has predefined performance information, a Maximum Power (MP) 72 capable of being utilized in that Power State 71 and an Actual Power (AP) 73 actually being used at that PowerState. AP 73 is a measured period according to the time unit (e.g., 1 minute) and Workload/QoS. In the current embodiment, each row in the power log 70 represents a power state which has been defined in the NVMe Specifications 1.3. For example, there are total 32 Power State defined in NVMe Specifications. In some embodiments, a vendor-specific definition can be used for each PowerState 71.

The power log 70 can include in its table entries the various PowerStates 71 and each PowerState's respective MP 72, AP 73 and additional information for identifying the power measurements and a relationship among Max Power/Power State, Actual Power, and QoS. QoS information can include, for example, current Entry Latency (ENTLAT), current Exit Latency (EXTLAT), RRT (Relative Read Throughput), RWT (Relative Write Throughput) and other suitable variables.

Figure 11:
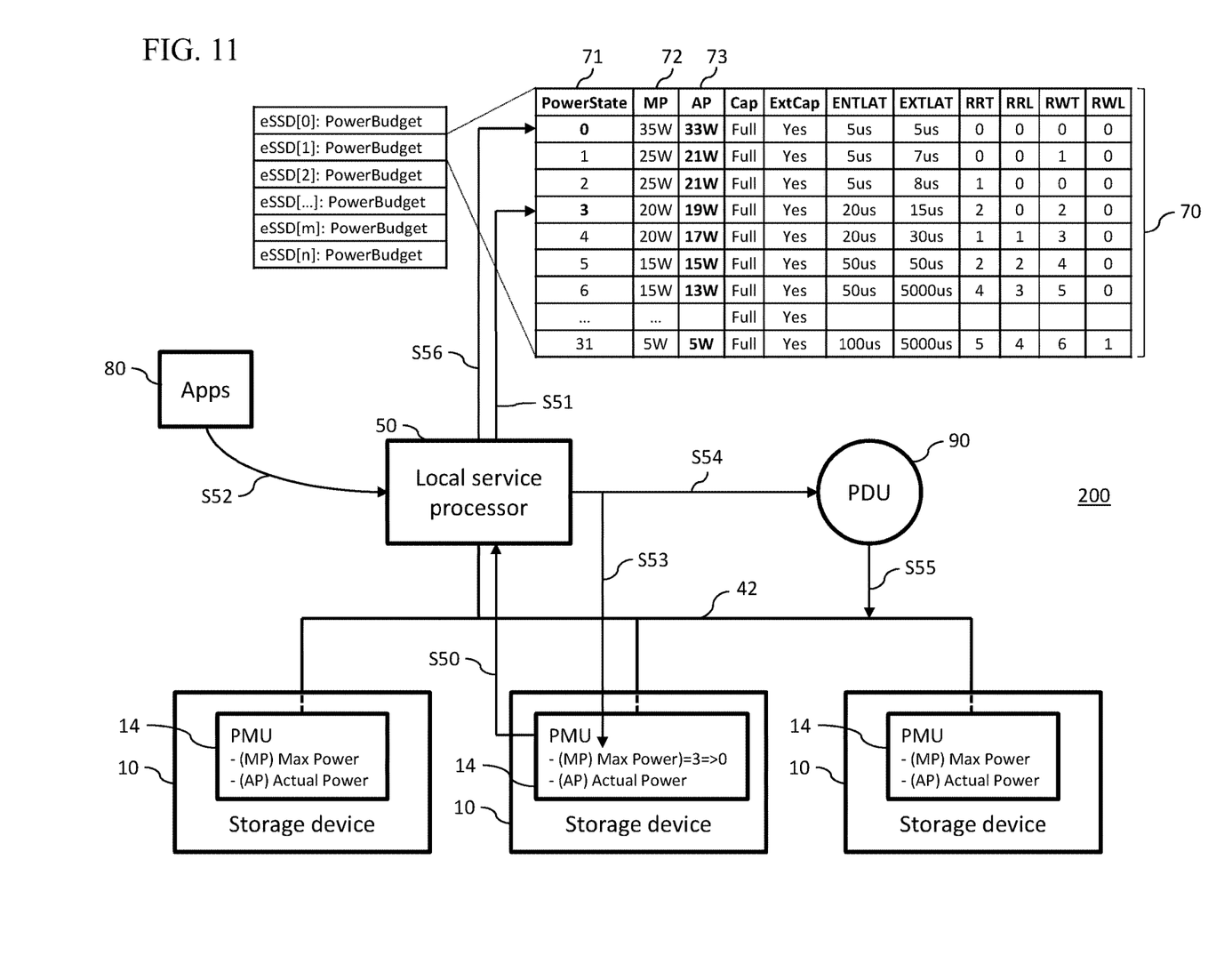
FIG. 11 is an illustrative method of how a storage system 200 manages the power reporting of multiple storage devices 10 in its chassis using the power log of FIG. 10.

FIGS. 10 and 11 illustrates a Power State_3 with a defined Max Power=20 W. However, the storage device 10 at this Power State currently consumes an Actual Power=19 W. Current QoS is shown in other columns such as RRT=2, RWT=2, ENTLAT=20 us and EXTLAT=15 us. If applications 80 run on a storage system 200 expect the best QoS (such as the best RRT & RWT), those applications 80 could instruct the local service processor 50 to give more power to the storage device 10 by transferring from Power State_3 to Power State_0.

The current PowerState 71 is retrieved by the local service processor 50 through the GetFeature (FeatureID=0x2), as discussed with respect to FIG. 5. An expected power state (i.e. power measurement budget) can be set by the local service processor 50 through the SetFeature (FeatureID=0x2), as discussed with respect to FIG. 6. Other power-related information can be managed by local service processor 50 through VUCmd (Vendor Unique Cmd) or directly accessed through the local service processor 50. For example, if the user would like to get power measurement information which is not defined in the NVMe specification, a VUCmd can be used to allow host retrieve such non-standard power information, similar to LogPage.

FIG. 11 is an illustrative method of how a storage system 200 manages the power reporting of multiple storage devices 10 in its chassis. According to this method, each PMU 14 of each storage device 10 measures the current AP 73 and stores the information in the power log 70, which is queried and/or retrieved (S50) by the local service processor 50. The local service processor 50 then updates/uploads (S51) the power log 70 from the local service processor 50 to the storage system 200. Various applications 80 in the storage system 200 can analyze (S52) the power logs 70 of the storage devices 10 in the chassis at the local service processor 50. The results of these analyses can determine how to allocate power for better performance, e.g., whether more power needs to be allocated to a particular PowerState 71 or whether power should be reallocated from one PowerState 71 to another to meet QoS demands. For example, the local service processor 50 can request (S53) that the storage device 10, as illustrated with respect to the center storage device 10 shown in FIG. 10, transfer Max Power State, in this example, from PowerState 3 to PowerState 0. The local service processor 50 can then either assign a new MP 72 to the storage devices 10 or can request (S54) a power distribution unit (PDU) 90 to assign a new MP 72 budget to the storage devices 10, i.e. redistributing power allocations. If the PDU 90 is used, the PDU will then assign (S55) the new MP 72 to the storage devices 10. The PDU 90 may be an independent component located in the chassis and may responsible for distributing MP to each storage device 10. The local service processor 50 then updates (S56) the power log 70 with the changes.

As discussed above, once the local service processor 50 has access and can read the power measurements, the local service processor 50 can then use that information to create graphs or histograms to trend projections and to run diagnostics.

Embodiments of the present invention also enable the local service processor to provide individual actual power profiles of each storage devices in the system to software developers, cloud service providers, users and others by allowing them to know the actual power consumption of their workloads consumed on each storage device. This provides the ability for software developers/users to optimize performance based on the actual cost of energy and also allows cloud service providers to provide more accurate billing of storage system users based on actual power consumption. Embodiments of the present invention can also provide better policing and tracking of storage devices violating an allocated power budget.

Embodiments of the present invention may be used in a variety of areas. For example, the embodiments of the present invention provide building blocks of crucial information that may be used for analysis purposes for artificial intelligence software, such as Samsung's DCP. The embodiments also provide information that may be useful to an ADRC (Active Disturbance Rejection) High Efficient Thermal control based system.

Although exemplary embodiments of the present invention have been described, it is understood that the present invention should not be limited to these exemplary embodiments but various changes and modifications can be made by one ordinary skilled in the art within the spirit and scope of the present invention as hereinafter claimed by appended claims and equivalents thereof.

What is claimed is:

1. A solid state storage device for reporting actual power consumption to a host processor comprising:
    an internal power metering unit;
    a memory including flash memory;
    two or more components comprising at least a controller and the memory, wherein the memory has stored thereon instructions that are configured to be executed by the controller, wherein the controller is capable of receiving information from the power metering unit via an interface and sending the information to the host processor; and
    one or more voltage rails connecting the power metering unit to the controller and the memory so that the power metering unit is capable of individually measuring a power consumed by the controller and a power consumed by the memory;
    wherein the information comprises power measurement information and the power measurement information comprises the measurements taken by the power metering unit measuring the power consumed by the controller and the power consumed by the memory; and
    wherein the memory has stored thereon instructions that, when executed by the controller, cause the controller to provide a power profile of the storage device based on the power measurement information measuring the power consumed by the controller and the power consumed by the memory to the host processor for sending to a cloud service provider.

2. The storage device of claim 1, wherein the memory has stored thereon instructions that, when executed by the controller, cause the controller to fetch the power measurement information from the power metering unit.

3. The storage device of claim 2, wherein the memory has stored thereon instructions that, when executed by the controller, cause the controller to send the power measurement information to a local service processor external to the storage device.

4. The storage device of claim 2, wherein the memory has stored thereon instructions that, when executed by the controller, cause the controller to save the power measurement information in a power log.

5. The storage device of claim 4, wherein the power log comprises proprietary log pages.

6. The storage device of claim 2, wherein the power measurement information is timestamped and annotated with a host ID.

7. The storage device of claim 1, wherein the memory has stored thereon instructions that, when executed by the controller, cause the controller to send a request to a local service processor requesting the power measurement budget limiting power consumption of the storage device.

8. The storage device of claim 7, wherein the memory has stored thereon instructions that, when executed by the controller, cause the controller to set the power measurement budget of the power metering unit.

9. The storage device of claim 1, wherein the memory has stored thereon instructions that, when executed by the controller, cause the controller to throttle the power consumed by the one or more components of the storage device in order to stay within the power measurement budget.

10. A method of reporting power consumption of a solid state storage device, the storage device comprising an internal power metering unit, a memory including flash memory, two or more components comprising at least a controller and the memory, wherein the memory has stored thereon instructions that are configured to be executed by the controller, and one or more voltage rails connecting the power metering unit to the controller and the memory of the one or more components, the method comprising:
    receiving information at the controller from the power metering unit via an interface;
    sending the information to a host processor from the controller;
    individually measuring at the power metering unit a power consumed by the controller and a power consumed by the memory, wherein said individual measurements comprise power measurement information;
    providing a power profile of the storage device based on the power measurement information measuring the power consumed by the controller and the power consumed by the memory to the host processor; and
    sending the power profile from the host processor to a cloud service provider.

11. The method of claim 10, further comprising fetching the power measurement information from the power metering unit by the controller.

12. The method of claim 10, further comprising sending power measurement information to a local service processor external to the storage device.

13. The method of claim 11, further comprising saving the power measurement information in a power log.

14. The method of claim 11, wherein the power measurement information is timestamped and annotated with a host ID.

15. The method of claim 10, further comprising requesting a power measurement budget limiting a maximum power consumption of the storage device from a local service processor.

16. The method of claim 15, further comprising setting the power measurement budget of the power metering unit.

17. The method of claim 10, further comprising throttling the power consumed by the two or more components of the storage device in order to stay within the power measurement budget.

18. A storage system comprising:
    a local service processor, and
    one or more solid state storage devices connected to the local service processor, each solid state storage device of the one or more solid state storage devices comprising:
        an internal power metering unit;
        a memory including flash memory;
        two or more components comprising at least a controller and the memory, wherein the memory has stored thereon instructions that are configured to be executed by the controller, wherein the controller is capable of receiving information from the power metering unit via an interface and sending the information to the local service processor; and
        one or more voltage rails connecting the power metering unit to the controller and the memory so that the power metering unit is capable of individually measuring a power consumed by the controller and a power consumed by the memory;

wherein the information comprises power measurement information and the power measurement information comprises the measurements taken by the power metering unit measuring the power consumed by the controller and the power consumed by the memory; and wherein the memory has stored thereon instructions that, when executed by the controller, cause the controller to provide a power profile of the one or more storage devices based on the power measurement information measuring the power consumed by the controller and the power consumed by the memory to the local service processor wherein the local service processor comprises a memory and a controller, and the memory of the local service processor has stored thereon instructions that are configured to be executed by the controller of the local service processor, wherein the controller of the local service processor is capable of sending the power profile to a cloud service provider.

19. The storage device of claim 1, wherein the power metering unit is configured to supply power to the controller and the memory via the one or more voltage rails.

* * * * *